(12) United States Patent (10) Patent No.: US 11,991,901 B2
Kim et al. (45) Date of Patent: May 21, 2024

(54) ELECTRONIC DEVICES WITH FLEXIBLE DISPLAY COVER LAYERS

(71) Applicant: Apple Inc., Cupertino, CA (US)

(72) Inventors: Hoon Sik Kim, San Jose, CA (US); Terry C. Lam, Mountain View, CA (US); Chang-Chia Huang, San Jose, CA (US); Paul S. Drzaic, Morgan Hill, CA (US); Yasmin F. Afsar, San Jose, CA (US); Young Cheol Yang, Sunnyvale, CA (US); Leiming Wang, Foster City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/194,530

(22) Filed: Mar. 31, 2023

(65) Prior Publication Data
US 2023/0240093 A1 Jul. 27, 2023

Related U.S. Application Data

(62) Division of application No. 17/879,705, filed on Aug. 2, 2022, now Pat. No. 11,647,648, which is a division
(Continued)

(51) Int. Cl.
*H10K 77/10* (2023.01)
*G09F 9/30* (2006.01)
(Continued)

(52) U.S. Cl.
CPC ............. *H10K 50/87* (2023.02); *G09F 9/301* (2013.01); *G09F 9/335* (2021.05);
(Continued)

(58) Field of Classification Search
CPC .. H10K 2102/311; B32B 2457/20–208; G09F 9/301; G09F 9/335
See application file for complete search history.

(56) References Cited

U.S. PATENT DOCUMENTS 8,530,253 B2 9/2013 Shin et al.
9,673,423 B2 6/2017 Lee et al.
(Continued)

FOREIGN PATENT DOCUMENTS

CN 104347000 A 2/2015
CN 105516409 A * 4/2016 ............. H04M 1/02
(Continued)

*Primary Examiner* — Mariceli Santiago
(74) *Attorney, Agent, or Firm* — Treyz Law Group, P.C.; Joseph F. Guihan; Jinie M. Guihan

(57) ABSTRACT

An electronic device may have a hinge that allows the device to be flexed about a bend axis. A display may span the bend axis. To facilitate bending about the bend axis without damage, the display may include a display cover layer with a flexible portion. The flexible portion of the display cover layer may be interposed between first and second rigid portions of the display cover layer. The display cover layer may also include a layer with self-healing properties. The layer of self-healing material may be formed across the entire display cover layer or may be formed only in the flexible region of the display cover layer. The display cover layer may include a layer of elastomer in the flexible region of the display cover layer for increased flexibility. Self-healing may be initiated or expedited by externally applied heat, light, electric current, or other type of external stimulus.

20 Claims, 16 Drawing Sheets

US 11,991,901 B2
Page 2

Related U.S. Application Data of application No. 16/774,948, filed on Jan. 28, 2020, now Pat. No. 11,444,268.

(60) Provisional application No. 62/824,168, filed on Mar. 26, 2019.

(51) Int. Cl.
| | | |
|---|---|---|
| *G09F 9/33* | (2006.01) | |
| *H04M 1/02* | (2006.01) | |
| *H05K 7/20* | (2006.01) | |
| *H10K 50/842* | (2023.01) | |
| *H10K 50/844* | (2023.01) | |
| *H10K 50/87* | (2023.01) | |
| *H10K 71/00* | (2023.01) | |
| *H10K 102/00* | (2023.01) | |

(52) U.S. Cl.
CPC ...... *H04M 1/0268* (2013.01); *H05K 7/20954* (2013.01); *H10K 50/8426* (2023.02); *H10K 50/844* (2023.02); *H10K 71/00* (2023.02); *H10K 77/111* (2023.02); *H10K 71/861* (2023.02); *H10K 2102/311* (2023.02)

(56) References Cited

U.S. PATENT DOCUMENTS

| | | |
|---|---|---|
| 9,947,899 B2 | 4/2018 | Liu |
| 10,020,462 B1 | 7/2018 | Ai et al. |
| 10,033,015 B1 | 7/2018 | Brotzman et al. |
| 10,078,243 B2 | 9/2018 | Kubota et al. |
| 10,241,377 B1 | 3/2019 | Wang et al. |
| 10,347,700 B2 | 7/2019 | Yang et al. |
| 10,504,971 B2 | 12/2019 | Yang et al. |
| 10,854,848 B1 | 12/2020 | Hrehor et al. |
| 2014/0287213 A1 | 9/2014 | Lee et al. |
| 2015/0212547 A1 | 7/2015 | Park et al. |
| 2016/0221316 A1 | 8/2016 | Yairi et al. |
| 2016/0271914 A1 | 9/2016 | Xie |
| 2017/0338440 A1 | 11/2017 | Oh et al. |
| 2018/0033830 A1 | 2/2018 | Kim et al. |
| 2018/0056636 A1 | 3/2018 | Xie |
| 2018/0217639 A1 | 8/2018 | Jones et al. |
| 2018/0237604 A1 | 8/2018 | Cho et al. |
| 2019/0051223 A1* | 2/2019 | Li .................. B32B 27/281 |
| 2019/0067635 A1 | 2/2019 | Yu et al. |
| 2019/0086760 A1 | 3/2019 | Wang et al. |
| 2020/0061967 A1 | 2/2020 | Cho et al. |
| 2021/0174710 A1 | 6/2021 | He |

FOREIGN PATENT DOCUMENTS

| | | | | |
|---|---|---|---|---|
| CN | 106328003 A | * | 1/2017 | |
| CN | 106409873 A | | 2/2017 | |
| CN | 107610595 A | | 1/2018 | |
| CN | 104992924 B | | 5/2018 | |
| CN | 108831307 A | * | 11/2018 | ............ G09F 9/301 |
| CN | 109216424 A | | 1/2019 | |
| CN | 109776753 A | | 5/2019 | |
| CN | 110183657 A | | 8/2019 | |
| CN | 209358595 U | * | 9/2019 | |
| CN | 110330891 A | | 10/2019 | |
| CN | 111724682 A | | 9/2020 | |
| KR | 20130022649 A | | 3/2013 | |
| KR | 20160069575 A | | 6/2016 | |

* cited by examiner

ELECTRONIC DEVICES WITH FLEXIBLE DISPLAY COVER LAYERS

This application is a division of non-provisional patent application Ser. No. 17/879,705, filed Aug. 2, 2022, which is a division of non-provisional patent application Ser. No. 16/774,948, filed Jan. 28, 2020, now U.S. Pat. No. 11,444,268, issued Sep. 13, 2022, which claims the benefit of provisional patent application No. 62/824,168, filed Mar. 26, 2019, which are hereby incorporated by reference herein in their entireties.

FIELD

This relates generally to electronic devices, and, more particularly, to electronic devices with displays.

BACKGROUND

Electronic devices often include displays for presenting images to a user. Displays are typically formed from rigid planar substrates. Although satisfactory in many situations, rigid displays such as these may be difficult to integrate into certain devices, such as devices with bendable housings.

SUMMARY

An electronic device may have a hinge that allows the device to be flexed about a bend axis. A display may span the bend axis. To facilitate bending about the bend axis without damage, the display may include a display cover layer with a flexible portion. The flexible portion of the display cover layer may be interposed between first and second rigid portions of the display cover layer in one example.

During operation of an electronic device, the display cover layer for the electronic device may be scratched or dented. To improve the aesthetics of the electronic device, it may be desirable for the presence of scratches and dents to be minimized. To help mitigate the number of dents, scratches, or other imperfections in a display cover layer, the display cover layer may include a layer of self-healing material.

The layer of self-healing material may be formed across the entire display cover layer or may be formed only in the flexible region of the display cover layer. The display cover layer may include a layer of elastomer in the flexible region of the display cover layer for increased flexibility. The layer of self-healing material may cover the layer of elastomer in the flexible region.

Self-healing may occur in the layer of self-healing material without prompting (e.g., when the self-healing coating is dented, the material of the coating may fill the dent even without external intervention). Alternatively, the self-healing may be initiated or expedited by externally applied heat, light, electric current, or other type of external stimulus.

When heat is used as a stimulus for the self-healing process, the display cover layer may include transparent conductors that form a heating layer in the display cover layer. The heating layer may be used to generate heat to stimulate self-healing. The heating layer may be used to generate heat in response to user input, according to a predetermined schedule, or when the electronic device is charging.

To promote flexibility in the display cover layer, the display cover layer may include a transparent dielectric layer with slits. The slits may be filled with an index-matching material.

DETAILED DESCRIPTION

Figure 1:
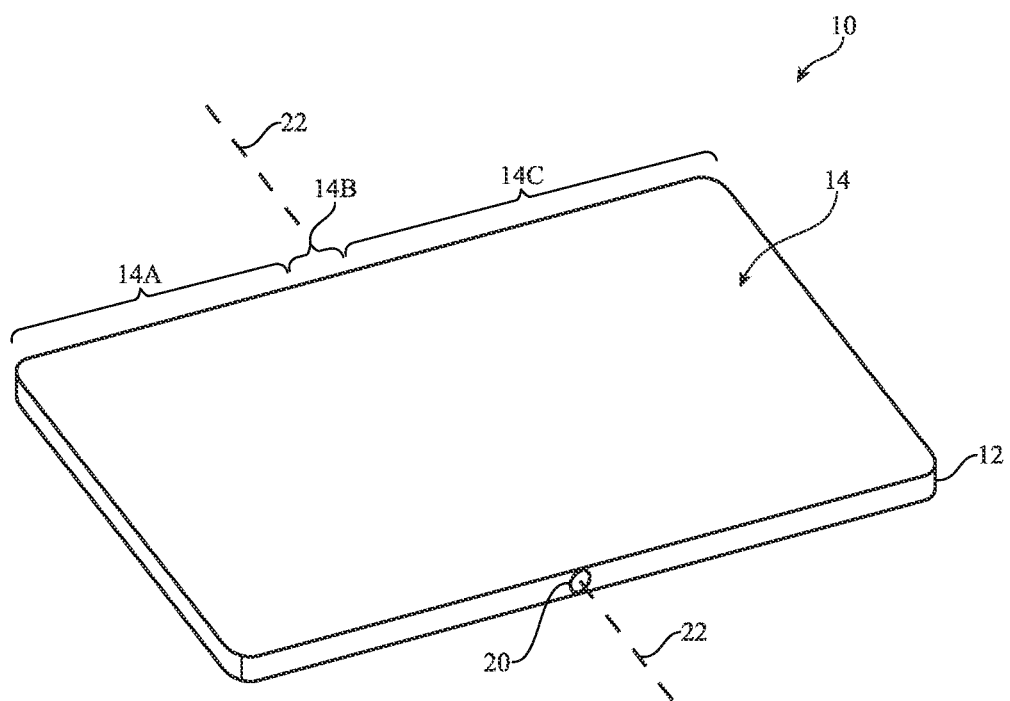
FIG. 1 is a perspective view of an illustrative electronic device having a display in accordance with an embodiment.

An illustrative electronic device of the type that may be provided with a flexible display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a wearable or miniature device of other types, a computer display that does not contain an embedded computer, a computer display that includes an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, watch or other wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have hinge structures such as hinge 20 to allow device 10 to bend about bend axis 22. Housing 12 may have first and second housing portions that rotate with respect to each other as device 10 is bent (folded) about bend axis 22 using hinge 20 or other flexible structures joining the first and second housing portions.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include pixels formed from liquid crystal display (LCD) components, electrophoretic pixels, microelectromechanical (MEMs) shutter pixels, electrowetting pixels, micro-light-emitting diodes (small crystalline semiconductor die), organic light-emitting diodes (e.g., pixels in a thin-film organic light-emitting diode display), or pixels based on other display technologies. Configurations in which display 14 has an array of light-emitting pixels such as an array of organic light-emitting diode pixels may sometimes be described herein as an example.

Display 14 may have a portion that overlaps bend axis 22. To facilitate bending of device 10 about axis 22, all of display 14 may be formed using flexible structures or at least the portion of display 14 that overlaps bend axis 22 may be formed using flexible structures. A display cover layer or other layer may form the outermost surface of the display. Display layers such these (e.g., display cover layers) may be formed from glass, plastic, and/or other transparent display cover layer structures and may be flexible (at least where these layers overlap bend axis 22 of device 10).

As shown in FIG. 1, for example, display 14 may have three portions such as portions 14A, 14B, and 14C. In portions 14A and 14C, display 14 may be flexible or may be rigid (e.g., the pixel array in these areas may be rigid and/or the display cover layer structures in these regions may be rigid). Flexible portion 14B overlaps bend axis 22 and forms a strip that lies between portions 14A and 14C and that extends across the width of the display between opposing edges of the display. To ensure that flexible portion 14B is sufficiently flexible to allow device 10 to bend about axis 22, display layers such as a display cover layer for display 14 may be formed from a thin flexible glass or polymer layer that accommodates bending of display 14 about axis 22 and underlying display layers (e.g., a polymer substrate, metal traces, a polarizer layer, a touch sensor layer, adhesive layers, and other conducting and dielectric layers in an organic light-emitting diode pixel array) may also be formed from flexible materials and structures.

Figure 2:
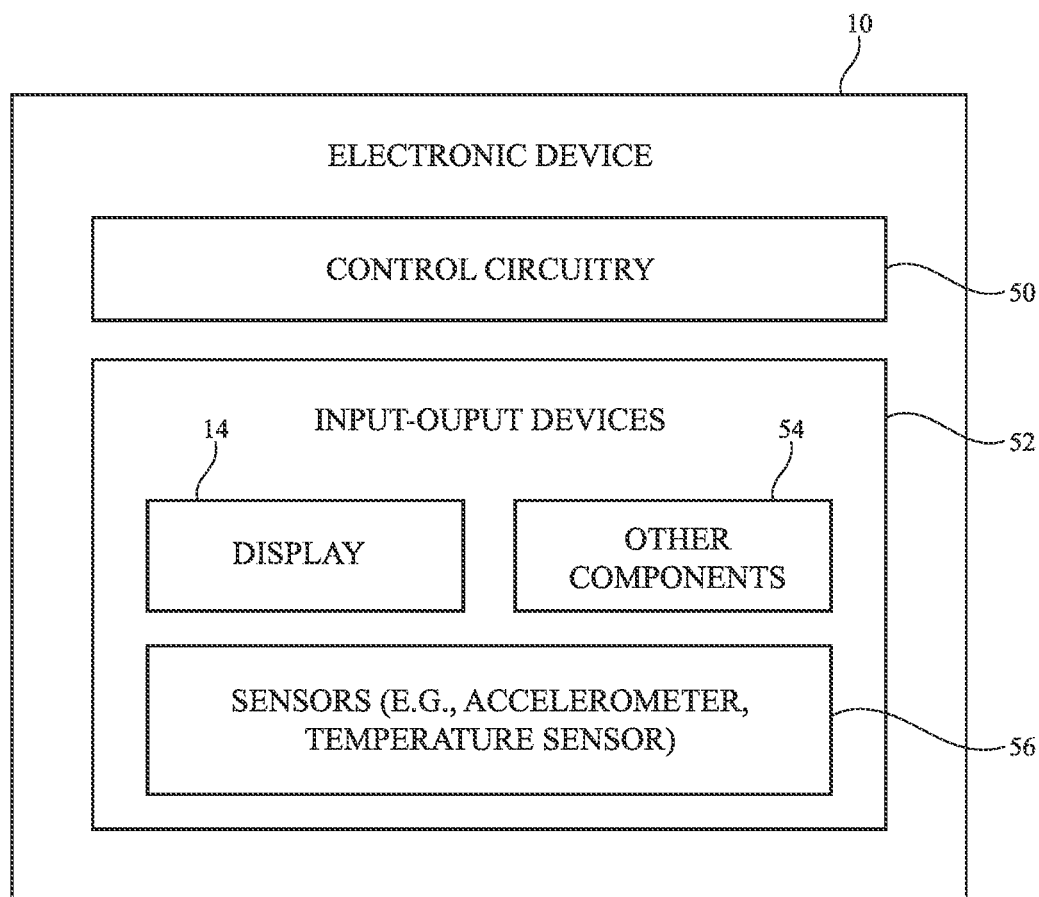
FIG. 2 is a schematic diagram of an illustrative electronic device having a display in accordance with an embodiment.

A schematic diagram of an illustrative electronic device such as device 10 of FIG. 1 is shown in FIG. 2. As shown in FIG. 2, electronic device 10 may have control circuitry 50. Control circuitry 50 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 50 may be used to control the operation of device 10 (e.g., to process sensor signals and other input and to control adjustable components such as a display, a heating element, etc.). The processing circuitry may be based on one or more microprocessors, microcontrollers, digital signal processors, baseband processors, power management units, audio chips, application specific integrated circuits, etc.

Input-output circuitry in device 10 such as input-output devices 52 may be used to allow data to be supplied to device 10 and to allow data to be provided from device 10 to external devices. As shown in FIG. 2, input-output devices 52 may include display 14. Display 14 may be a touch screen that incorporates a two-dimensional touch sensor or may be insensitive to touch. A two-dimensional touch sensor for display 14 may be formed from an array of capacitive touch electrodes touch sensor or other touch sensor components (e.g., force sensors, resistive touch sensors, acoustic touch sensors, optical sensors, etc.).

Input-output devices 52 may include sensors 56. Sensors 56 may include a capacitive proximity sensor, a light-based proximity sensor, a magnetic sensor, a force sensor such as a force sensor that gathers user input, a touch sensor for gathering user touch input, a temperature sensor, a pressure sensor, an ambient light sensor, a microphone or other sound sensor that gathers ambient noise measurements and user input such as voice commands, sensors for gathering data on device position and motion such as inertial measurement units that include accelerometers, compasses, and/or gyroscopes, and/or other sensors.

Input-output devices 52 may also include other components 54 such as buttons, joysticks, scrolling wheels, touch pads, key pads, keyboards, speakers, tone generators, vibrators, cameras, light-emitting diodes and other status indicators, data ports, etc. A user can control the operation of device 10 by supplying user input commands through input-output devices 52 and may receive status information and other output from device 10 using the output resources of input-output devices 52.

Control circuitry 50 may be used to run software on device 10 such as operating system code and applications. During operation of device 10, the software running on control circuitry 50 may display images on display 14 (e.g., video, still images such as text, alphanumeric labels, photographs, icons, other graphics, etc.) using an array of pixels in display 14.

Figure 3:
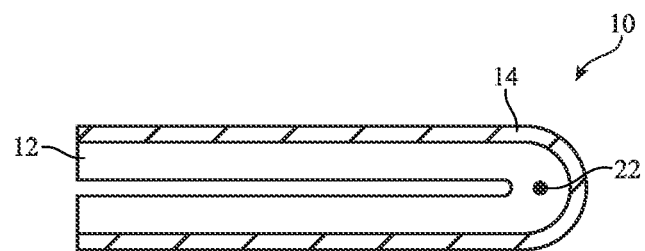
FIGS. 3 and 4 are cross-sectional side views of electronic devices with flexible displays in accordance with an embodiment.
Figure 4:
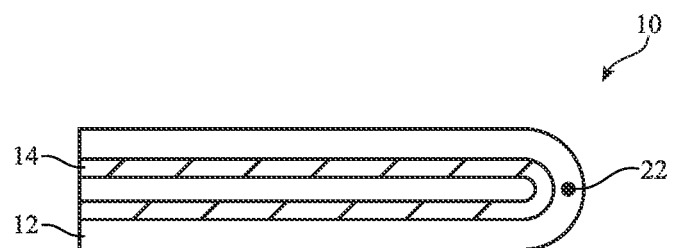

As shown in FIG. 3, device 10 may be folded (bent by 180° or other suitable amount) about bend axis 22 so that display 14 is visible from the outside of device 10 in its folded state. FIG. 4 shows how device 10 may be folded about bend axis 22 so that display 14 is protected within the interior of device 10. Device 10 may have flexible structures (e.g., a hinge) to allow outward bending of the type shown in FIG. 3, to allow inward bending of the type shown in FIG. 4, or to allow bending of both the type shown in FIG. 3 and the type shown in FIG. 4. Configurations in which device 10 is flexed by different amounts (e.g., more than 180° or less than 180°) may also be used.

Figure 5:
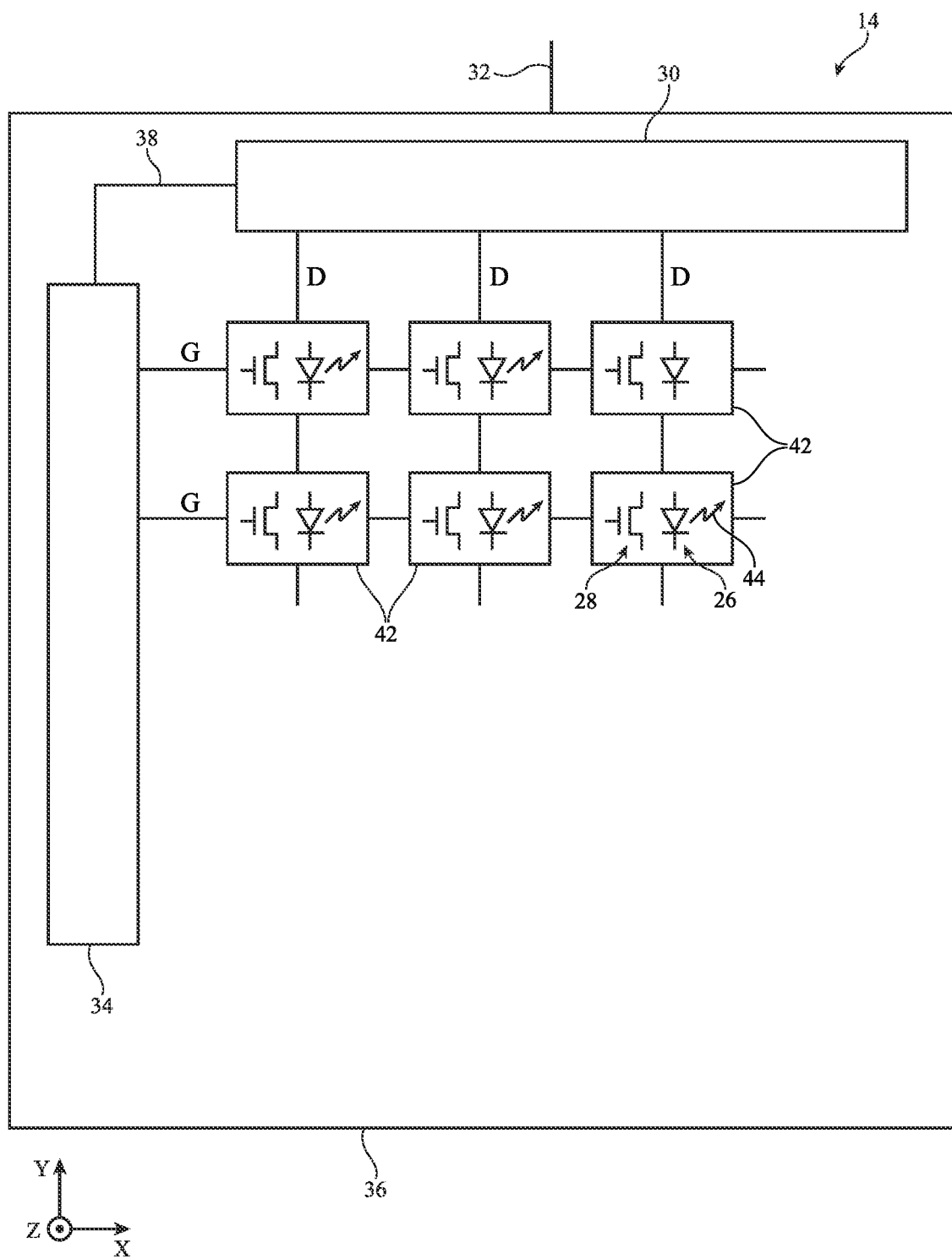
FIG. 5 is a diagram of an illustrative display with an array of light-emitting pixels in accordance with an embodiment.

Display 14 may have a rectangular shape (i.e., display 14 may have a rectangular footprint and a rectangular peripheral edge that runs around the rectangular footprint) or may have other suitable shapes. A top view of circuitry in an illustrative display with a rectangular shape is shown in FIG. 5. As shown in FIG. 5, display 14 may have an array of pixels 42 formed on substrate 36. Substrate 36 may be formed from glass, metal, plastic, ceramic, or other substrate materials. Pixels 42 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 42 in display 14 (e.g., tens or more, hundreds or more, or thousands or more). Each pixel 42 may have a light-emitting diode 26 that emits light 44 under the control of a pixel circuit formed from thin-film transistor circuitry such as thin-film transistors 28 and thin-film capacitors). Thin-film transistors 28 may be polysilicon thin-film transistors, semiconducting-oxide thin-film transistors such as indium gallium zinc oxide transistors, or thin-film transistors formed from other semiconductors. Pixels 42 may contain light-emitting diodes of different colors (e.g., red, green, and blue diodes for red, green, and blue pixels, respectively) to provide display 14 with the ability to display color images.

Display driver circuitry may be used to control the operation of pixels 42. The display driver circuitry may be formed from integrated circuits, thin-film transistor circuits, or other suitable circuitry. Display driver circuitry 30 of FIG. 2 may contain communications circuitry for communicating with system control circuitry such as control circuitry 50 of FIG. 2 over path 32. Path 32 may be formed from traces on a flexible printed circuit or other cable. During operation, the control circuitry (e.g., control circuitry 50 of FIG. 2) may supply circuitry 30 with information on images to be displayed on display 14.

To display the images on pixels 42, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14 or may use display driver circuitry with other layouts. The configuration of FIG. 5 is illustrative.

Gate driver circuitry 34 (sometimes referred to as horizontal control line control circuitry) may be implemented as part of an integrated circuit and/or may be implemented using thin-film transistor circuitry. Gate lines G (sometimes referred to as horizontal control lines) in display 14 may carry gate line signals (sometimes referred to as scan line signals, emission enable control signals, etc.) for controlling the pixels of each row. There may be any suitable number of control signals per row of pixels 42 (e.g., one or more, two or more, three or more, four or more, etc.).

Display 14 may have an outermost layer formed from clear glass, transparent plastic, sapphire, or other transparent materials that serve as a protective layer for thin-film transistor circuitry and other display structures. The outer display layer may sometimes be referred to as a display cover layer. In some configurations for display 14, the outermost layer of the display may serve both as a protective layer (display cover layer) and as a substrate for display structures (touch sensors electrodes, color filter elements, thin-film transistors, etc.). In other configurations, the display cover layer is free of circuitry and serves solely as a protective layer for underlying display structures (e.g., one or more underlying display panels).

Figure 6:
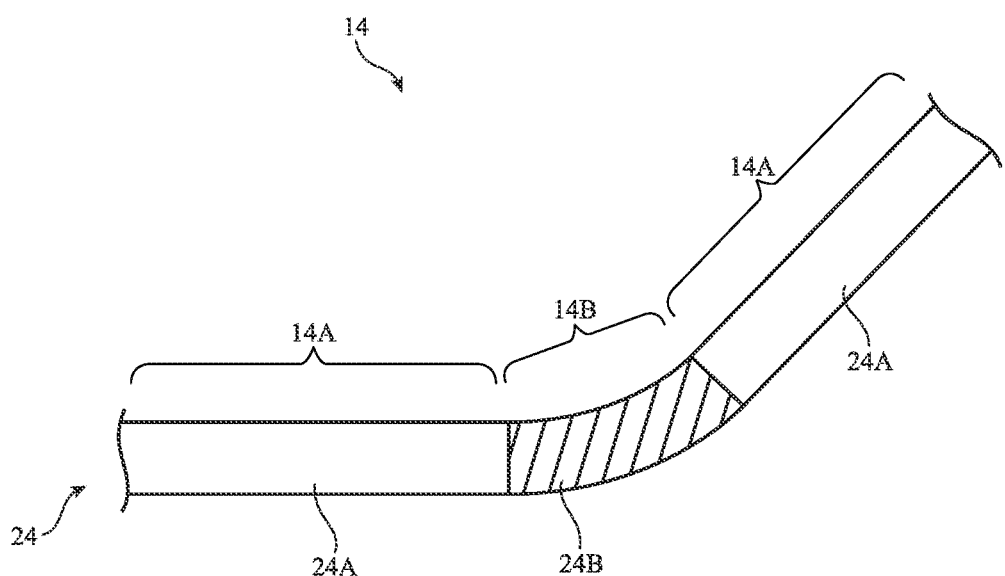
FIG. 6 is a cross-sectional side view of a display showing how a display cover layer may have a flexible portion interposed between rigid portions in accordance with an embodiment.

As shown in FIG. 6, a display cover layer for display 14 (i.e., display cover layer 24) may have rigid portions such as rigid portions 24A and flexible portions such as flexible portion 24B. Rigid portions 24A may, for example, be rigid planar layers. Configurations in which portions 24A have non-planar shapes and/or are formed from flexible structures may also be used. Between rigid planar portions 24A of display cover layer 24, display cover layer 24 may have flexible portion 24B. Portion 24B may bend about bend axis 22 to allow display 14 to bend as housing 12 is bent about hinge 20.

In the example of FIG. 6, flexible portion 24B of display cover layer 24 aligns with flexible region 14B of display 14 (e.g., the region of display 14 that bends about bend axis 22). This is, however, merely illustrative. If desired, display cover layer 24 may include flexible regions 24B in rigid areas 14A of display 14 (e.g., in areas of display 14 that do not bend, that are prevented from being bent, or that are otherwise less flexible than regions 14B).

In some cases, display cover layer 24 may be formed from a single transparent layer formed from glass, plastic, sapphire, or another transparent material. In other arrangements, however, display cover layer 24 may include more than one layer of material. For example, in addition to a transparent dielectric layer, the display cover layer may include a layer with self-healing properties.

During operation of an electronic device, the display cover layer for the electronic device may be scratched or dented. To improve the aesthetics of electronic device, it may be desirable for the presence of scratches and dents to be minimized. To help mitigate the number of dents, scratches, or other imperfections in a display cover layer, the display cover layer may include a layer with self-healing properties (e.g., a layer of self-healing material). For example, a self-healing coating may be formed on a transparent dielectric layer. The self-healing coating may be dented or scratched during operation of the electronic device. However, because of the self-healing properties of the self-healing coating, the self-healing coating may return to its original shape and the dents and scratches may be removed. The self-healing may occur without prompting (e.g., when the self-healing coating is dented, the material of the coating may fill the dent even without intervention from an external influence). Alternatively, the self-healing may be initiated or expedited by externally applied heat, light, electric current, or other type of external stimulus.

Figure 7:
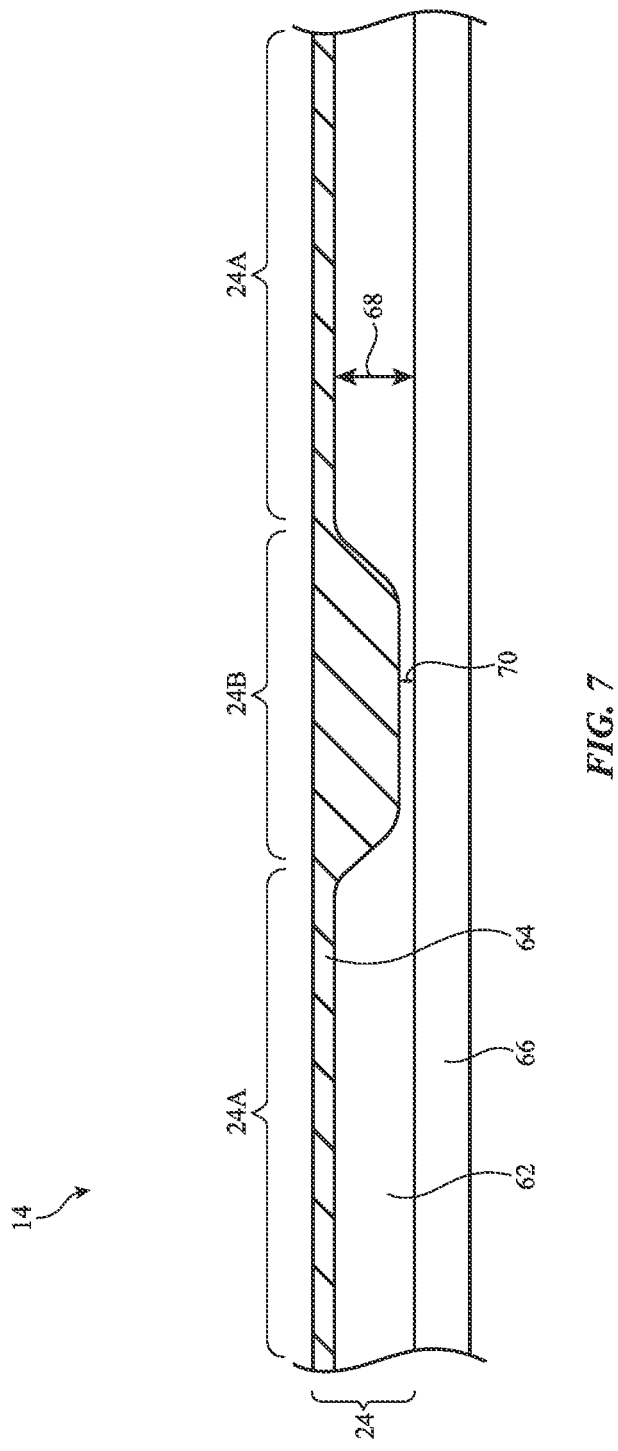
FIG. 7 is a cross-sectional side view of a display that includes a display cover layer with a layer of self-healing material in accordance with an embodiment.

FIG. 7 is a cross-sectional side view of a display that includes a display cover layer with a layer of self-healing material. As shown in FIG. 7, display cover layer 24 includes a transparent dielectric layer 62. The display cover layer may cover underlying display layers 66 in the display (e.g., substrate 36 and other layers that form the light-emitting diodes and control circuitry of FIG. 5). Transparent dielectric layer 62 may be formed from a transparent layer of plastic, glass, sapphire, or any other desired material. Display cover layer 24 also includes a layer of self-healing material 64. The layer of self-healing material 64 may, for example, form an exterior surface of the display cover layer (meaning that the self-healing layer 64 is exposed to the exterior of the electronic device). By forming self-healing material at the exterior of the display cover glass, the self-healing material will be exposed during operation of the device. However, as previously mentioned, the self-healing material may be able to automatically repair any damage to itself. The self-healing material may automatically repair any damage to itself without external intervention or the self-healing process may be initiated by heat, light, or another external stimulus. The self-healing layer 64 may be formed from polymer or any other desired material having self-healing properties.

To ensure that flexible portion 24B of display cover layer 24 has sufficient flexibility, the transparent dielectric layer 62 may have a reduced thickness in flexible portion 24B. As shown in FIG. 7, transparent dielectric layer 62 has a thickness 68 in rigid portions 24A of the display cover layer and a thickness 70 in flexible portion 24B of the display cover layer. Thickness 70 is less than thickness 68. Thinning the transparent dielectric layer in this way may increase flexibility in the flexible region.

Self-healing layer 64 may be elastic to allow for sufficient flexibility in the flexible portion of the display cover layer. Self-healing layer 64 may be more elastic than transparent dielectric layer 62. Self-healing layer 64 is thicker in flexible region 24B than in the rigid regions 24A of the display cover layer. As previously mentioned, flexible region 24B may bend about bend axis 22 to allow display 14 to bend as housing 12 is bent about hinge 20. Self-healing layer 64 may therefore both provide a self-healing coating across the display cover layer for improved aesthetic and mechanical display cover layer performance and provide increased flexibility to allow bending in the display cover layer.

In FIG. 7, display cover layer 24 is depicted as having a single transparent dielectric layer 62 that has a reduced thickness portion in flexible region 24B of the display cover layer. This example, however, is merely illustrative. Display cover layer 24 may instead include multiple layers of transparent dielectric material that are attached together. An example of this type is shown in FIG. 8.

Figure 8:
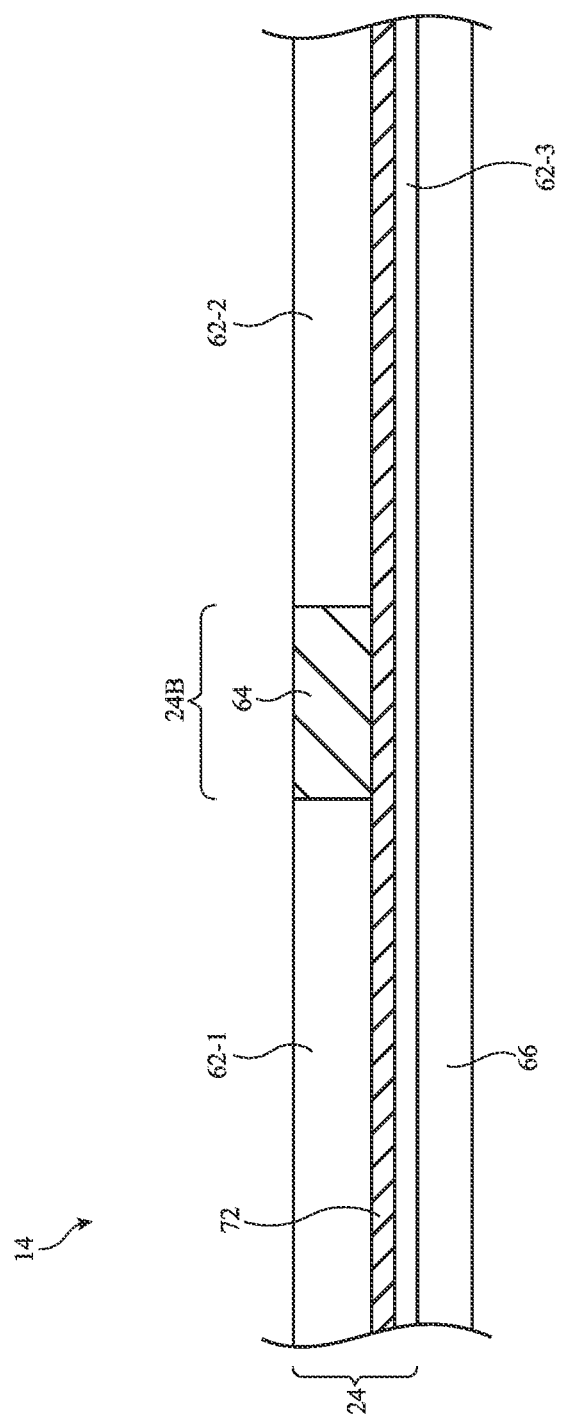
FIG. 8 is a cross-sectional side view of an illustrative display having a display cover layer formed from multiple layers of transparent dielectric material in accordance with an embodiment.

FIG. 8 is a cross-sectional side view of an illustrative display having a display cover layer formed from multiple layers of transparent dielectric material. As shown in FIG. 8, display cover layer 24 includes transparent dielectric layers 62-1, 62-2, and 62-3. The display cover layer may cover underlying display layers 66 in the display (e.g., substrate 36 and other layers that form the light-emitting diodes and control circuitry of FIG. 5). Transparent dielectric layers 62-1, 62-2, and 62-3 may be formed from transparent layers of plastic, glass, sapphire, or any other desired material.

Display cover layer 24 also includes a layer of self-healing material 64. The layer of self-healing material 64 may, for example, form a portion of an exterior surface of the display cover layer in flexible region 24B of the display cover layer. To ensure that flexible portion 24B of display cover layer 24 has sufficient flexibility, the cumulative thickness of the transparent dielectric layers is reduced in flexible portion 24B. As shown in FIG. 8, transparent dielectric layers 62-1 and 62-2 are formed on first and second opposing sides of self-healing material 64. An adhesive layer 72 attaches the transparent dielectric layers 62-1 and 62-2 to transparent dielectric layer 62-3. Adhesive layer 72 may be formed from pressure sensitive adhesive or a liquid adhesive. Adhesive layer 72 may be an optically clear adhesive (OCA).

Transparent dielectric layer 62-3 may be thinner than transparent dielectric layers 62-1 and 62-2. In this way, the shape of the single transparent dielectric layer 62 in FIG. 7 is approximated with multiple transparent dielectric layers in FIG. 8. Using multiple transparent dielectric layers attached together to produce a reduced transparent dielectric layer thickness area (as in FIG. 8) may result in reduced manufacturing time and costs compared to using a single transparent dielectric layer with a thinned region to produce a reduced transparent dielectric layer thickness area (as in FIG. 7).

Self-healing layer 64 may be elastic to allow for sufficient flexibility in the flexible portion of the display cover layer. Self-healing layer 64 may be more elastic than transparent dielectric layers 62-1, 62-2, and 62-3. As previously mentioned, flexible region 24B may bend about bend axis 22 to allow display 14 to bend as housing 12 is bent about hinge 20. Self-healing layer 64 may therefore both provide a self-healing portion of the display cover layer and provide increased flexibility to allow bending in the display cover layer.

Figure 9:
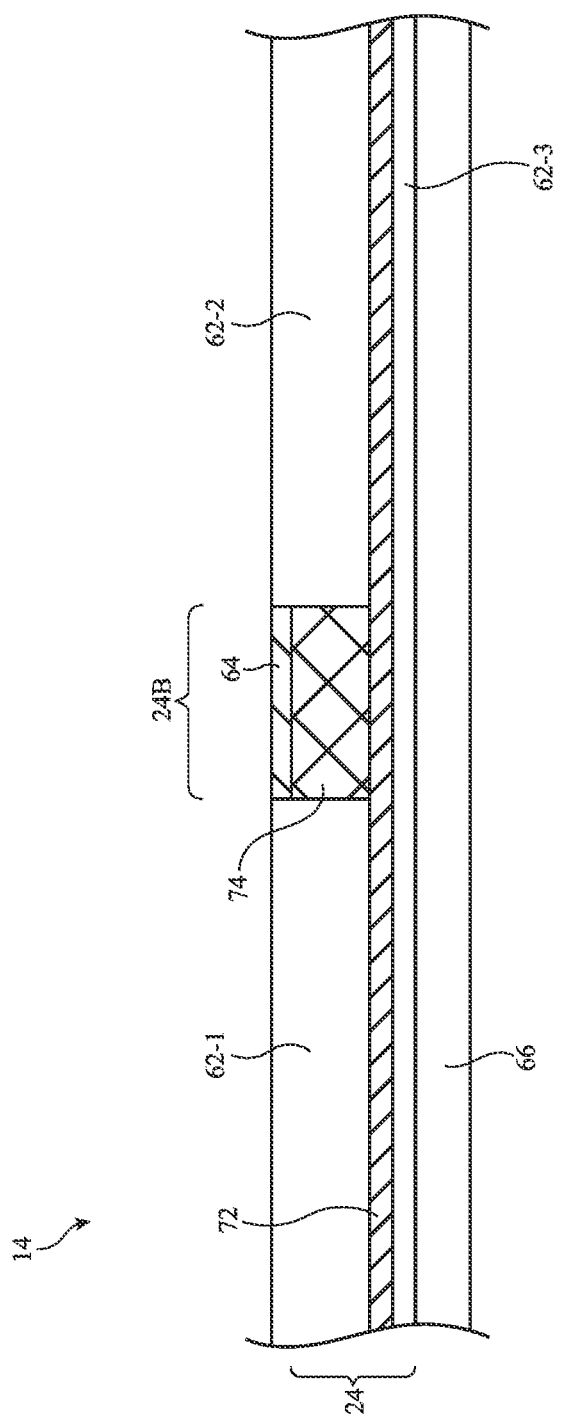
FIG. 9 is a cross-sectional side view of an illustrative display having a display cover layer with a layer of elastomer formed in a flexible region of the display cover layer in accordance with an embodiment.

FIG. 9 is a cross-sectional side view of an illustrative display having a display cover layer with an elastomer formed in a flexible region of the display cover layer. As shown in FIG. 9, similar to as in FIG. 8 display cover layer 24 includes transparent dielectric layers 62-1, 62-2, and 62-3. The display cover layer may cover underlying display layers 66 in the display (e.g., substrate 36 and other layers that form the light-emitting diodes and control circuitry of FIG. 5). Transparent dielectric layers 62-1, 62-2, and 62-3 may be formed from transparent layers of plastic, glass, sapphire, or any other desired material. The nomenclature of referring to transparent dielectric layers 62-1 and 62-2 as separate dielectric layers is merely illustrative. In some cases, these transparent dielectric layers may be referred to as a single transparent dielectric layer with an opening (e.g., that is filled with elastomer and/or self-healing material).

Display cover layer 24 also includes a layer of self-healing material 64. The layer of self-healing material 64 may, for example, form a portion of an exterior surface of the display cover layer in flexible region 24B of the display cover layer. To ensure that flexible portion 24B of display cover layer 24 has sufficient flexibility, an elastomer layer 74 is also formed in flexible portion 24B of the display cover layer. Elastomer layer 74 may be more elastic than self-healing layer 64. Therefore, the presence of elastomer layer 74 may increase the flexibility of flexible region 24B (compared to when only the self-healing layer 64 is present in flexible region 24B as in FIG. 8). Elastomer layer 74 may be formed from any desired material (e.g., a natural or synthetic polymer). Elastomer layer 74 may have a Young's modulus that is lower than the Young's modulus of self-healing layer 64 and self-healing layer 64 may have a Young's modulus that is lower than the Young's modulus of the transparent dielectric layers.

Adhesive layer 72 attaches the transparent dielectric layers 62-1 and 62-2 as well as elastomer layer 74 to transparent dielectric layer 62-3. Adhesive layer 72 may be formed from pressure sensitive adhesive or a liquid adhesive. Adhesive layer 72 may be an optically clear adhesive (OCA). As previously mentioned, flexible region 24B may bend about bend axis 22 to allow display 14 to bend as housing 12 is bent about hinge 20.

Figure 10:
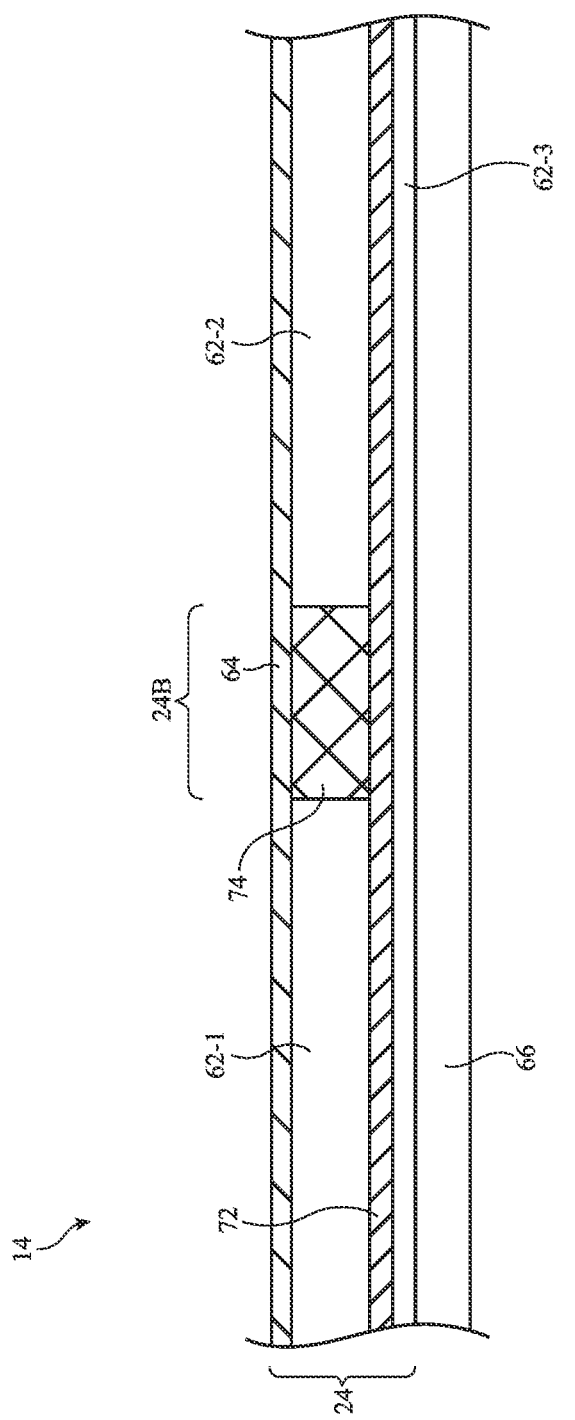
FIG. 10 is a cross-sectional side view of an illustrative display in which the display cover layer includes a self-healing coating across the display cover layer and an elastomer layer in the flexible region of the display cover layer in accordance with an embodiment.

FIG. 10 is a cross-sectional side view of an illustrative display in which the cover layer includes a self-healing coating across the display cover layer and an elastomer layer in the flexible region of the display cover layer. As shown in FIG. 10, display cover layer 24 includes transparent dielectric layers 62-1, 62-2, and 62-3. The display cover layer may cover underlying display layers 66 in the display (e.g., substrate 36 and other layers that form the light-emitting diodes and control circuitry of FIG. 5). Transparent dielectric layers 62-1, 62-2, and 62-3 may be formed from transparent layers of plastic, glass, sapphire, or any other desired material.

Display cover layer 24 also includes a layer of self-healing material 64. The layer of self-healing material 64 may, for example, form an exterior surface of the display cover layer (meaning that the self-healing layer 64 is exposed to the exterior of the electronic device). The self-healing material may extend across the entire exterior surface of the display cover layer. By forming self-healing material at the exterior of the display cover glass, the self-healing material will be exposed during operation of the device. However, as previously mentioned, the self-healing material may be able to automatically repair any damage to itself. The self-healing material may automatically repair any damage to itself without external intervention or the self-healing process may be initiated by heat, light, or another external stimulus. The self-healing layer 64 may be formed from polymer or any other desired material having self-healing properties.

To ensure that flexible portion 24B of display cover layer 24 has sufficient flexibility, an elastomer layer 74 is also formed in flexible portion 24B of the display cover layer. Elastomer layer 74 may be more elastic than self-healing layer 64. Therefore, the presence of elastomer layer 74 may increase the flexibility of flexible region 24B. Elastomer layer 74 may be formed from any desired material (e.g., a natural or synthetic polymer). Elastomer layer 74 may have a Young's modulus that is lower than the Young's modulus of self-healing layer 64 and self-healing layer 64 may have a Young's modulus that is lower than the Young's modulus of the transparent dielectric layers.

Adhesive layer 72 attaches the transparent dielectric layers 62-1 and 62-2 as well as elastomer layer 74 to transparent dielectric layer 62-3. Adhesive layer 72 may be formed from pressure sensitive adhesive or a liquid adhesive. Adhesive layer 72 may be an optically clear adhesive (OCA). As previously mentioned, flexible region 24B may bend about bend axis 22 to allow display 14 to bend as housing 12 is bent about hinge 20.

Figure 11:
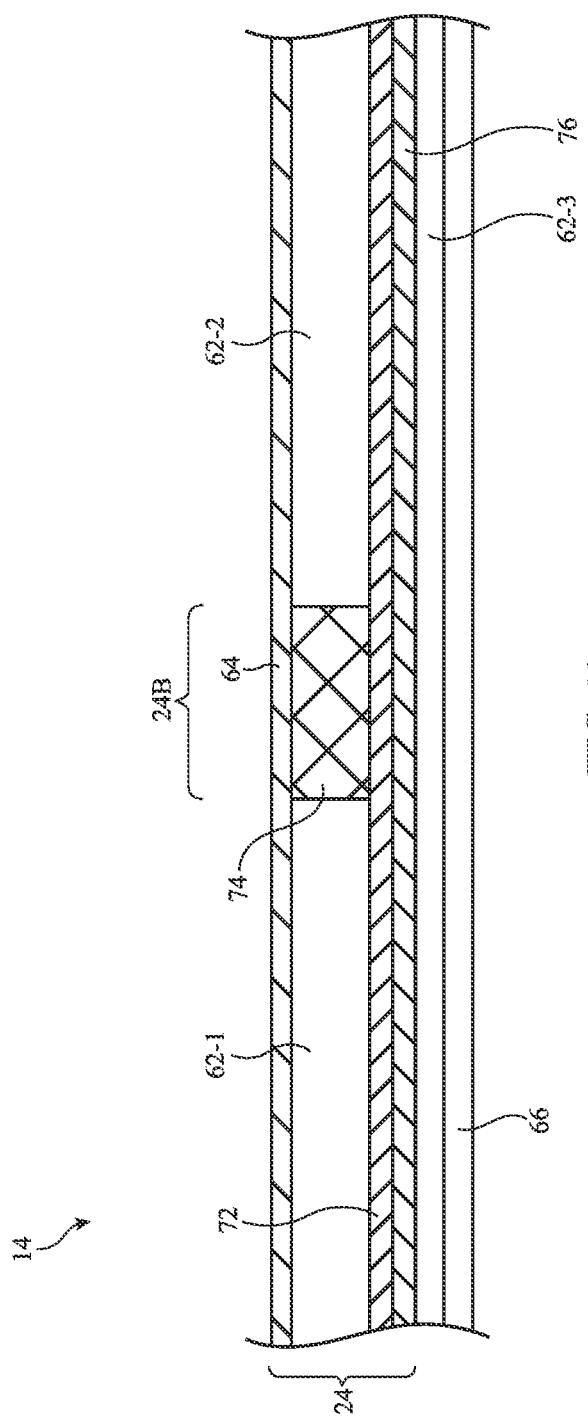
FIG. 11 is a cross-sectional side view of an illustrative display in which the display cover layer includes a self-healing coating across the display cover layer and a heating layer that heats the self-healing coating in accordance with an embodiment.

FIG. 11 is a cross-sectional side view of an illustrative display in which the display cover layer includes a self-healing coating across the display cover layer and a heating layer that heats the self-healing coating. As shown in FIG. 11, display cover layer 24 includes transparent dielectric layers 62-1, 62-2, and 62-3. The display cover layer may cover underlying display layers 66 in the display (e.g., substrate 36 and other layers that form the light-emitting diodes and control circuitry of FIG. 5). Transparent dielectric layers 62-1, 62-2, and 62-3 may be formed from transparent layers of plastic, glass, sapphire, or any other desired material.

Display cover layer 24 also includes a layer of self-healing material 64. The layer of self-healing material 64 may, for example, form an exterior surface of the display cover layer (meaning that the self-healing layer 64 is exposed to the exterior of the electronic device). By forming self-healing material at the exterior of the display cover glass, the self-healing material will be exposed during operation of the device. However, as previously mentioned, the self-healing material be able to automatically repair any damage to itself. The self-healing process of the self-healing material may be initiated or expedited by heat. Therefore, a heating element may be included in the display cover layer to heat the self-healing layer.

As shown in FIG. 11, heating layer 76 may be formed between transparent dielectric layer 62-3 and adhesive layer 72. The heating layer may be a resistive heater in which the passage of electric current through a conductor produces heat. In other words, the heating layer may include conductive traces (e.g., on a surface of transparent dielectric layer 62-3) that receive an applied electric current. For example, a first end of the conductive traces may be coupled to a positive power supply terminal and a second end of the conductive traces may be coupled to a ground power supply terminal. The conductive traces of heating layer 76 may follow a meandering path (e.g., the conductive traces may have a series of bends to extend the length of the traces and accordingly increase the resistance of the conductive traces). The conductive traces of heating layer 76 may be formed from a transparent conductive material such as indium tin oxide (ITO) or silver nanowire.

To ensure that flexible portion 24B of display cover layer 24 has sufficient flexibility, an elastomer layer 74 is also formed in flexible portion 24B of the display cover layer. Elastomer layer 74 may be more elastic than self-healing layer 64. Therefore, the presence of elastomer layer 74 may increase the flexibility of flexible region 24B. Elastomer layer 74 may be formed from any desired material (e.g., a natural or synthetic polymer). Elastomer layer 74 may have a Young's modulus that is lower than the Young's modulus of self-healing layer 64 and self-healing layer 64 may have a Young's modulus that is lower than the Young's modulus of the transparent dielectric layers.

Adhesive layer 72 attaches the transparent dielectric layers 62-1 and 62-2 as well as elastomer layer 74 to heating layer 76 and transparent dielectric layer 62-3. Adhesive layer 72 may be formed from pressure sensitive adhesive or a liquid adhesive. Adhesive layer 72 may be an optically clear adhesive (OCA). As previously mentioned, flexible region 24B may bend about bend axis 22 to allow display 14 to bend as housing 12 is bent about hinge 20.

The heating layer may selectively be heated in order to stimulate the self-healing of self-healing material 64. Control circuitry within the electronic device (e.g., control circuitry 50 in FIG. 2) may be used to provide signals (e.g., an electric current) to heating layer 76 to generate heat with the heating layer. The control circuitry may heat the heating layer in response to user input. For example, a user of the electronic device may provide instructions to the electronic device using one or more of the input-output devices in the electronic device (e.g., input-output devices 52 in FIG. 2). The user may, for example, use the input-output devices to provide instructions for immediately generating heat with the heating layer for the self-healing process. Alternatively, the user may schedule a time or times at which the heating layer will generate heat for the self-healing process.

In other arrangements, control circuitry in the electronic device may determine when to use the heating layer to generate heat without user input. For example, the control circuitry may provide signals to the heating layer to generate heat after a predetermined amount of electronic device usage or according to a predetermined schedule. The control circuitry may analyze the historical device usage and provide signals to the heating layer to generate heat based on the historical device usage. In other embodiments, the control circuitry may provide signals to the heating layer to generate heat when the electronic device is being charged (e.g., when the electronic device receives wireless or wired power to provide power for operating the electronic device or to recharge the electronic device battery) or in other predetermined usage scenarios.

Control circuitry in the electronic device may monitor the temperature of the heating layer to ensure that the temperature of the electronic device does not exceed certain temperature thresholds. For example, the electronic device may have a maximum allowable temperature above which the internal components of the electronic device may be compromised. The electronic device may have a safety temperature above which the electronic device may not be safe for a user to touch. The control circuitry may stop generating heat with the heating layer if any desired temperature limit is exceeded.

In general, it may be desirable for the components of display cover layer 64 to have similar indices of refraction in order to avoid different portions of the display cover layer having different appearances. The materials used to form the display cover layer may be selected to have similar indices of refraction. For example, elastomer 74 may have a similar index of refraction as transparent dielectric layers 62-1 and 62-2 (e.g., the two indices of refraction may be within 0.2, within 0.1, within 0.05, without 0.03, within 0.01, etc.). Elastomer 74 may have a similar index of refraction as self-healing layer 64 (e.g., the two indices of refraction may be within 0.2, within 0.1, within 0.05, without 0.03, within 0.01, etc.). Transparent dielectric layers 62-1 and 62-2 may have a similar index of refraction as self-healing layer 64 (e.g., the two indices of refraction may be within 0.2, within 0.1, within 0.05, without 0.03, within 0.01, etc.). Elastomer 74 may have a similar index of refraction as adhesive layer 72 (e.g., the two indices of refraction may be within 0.2, within 0.1, within 0.05, without 0.03, within 0.01, etc.).

Figure 12:
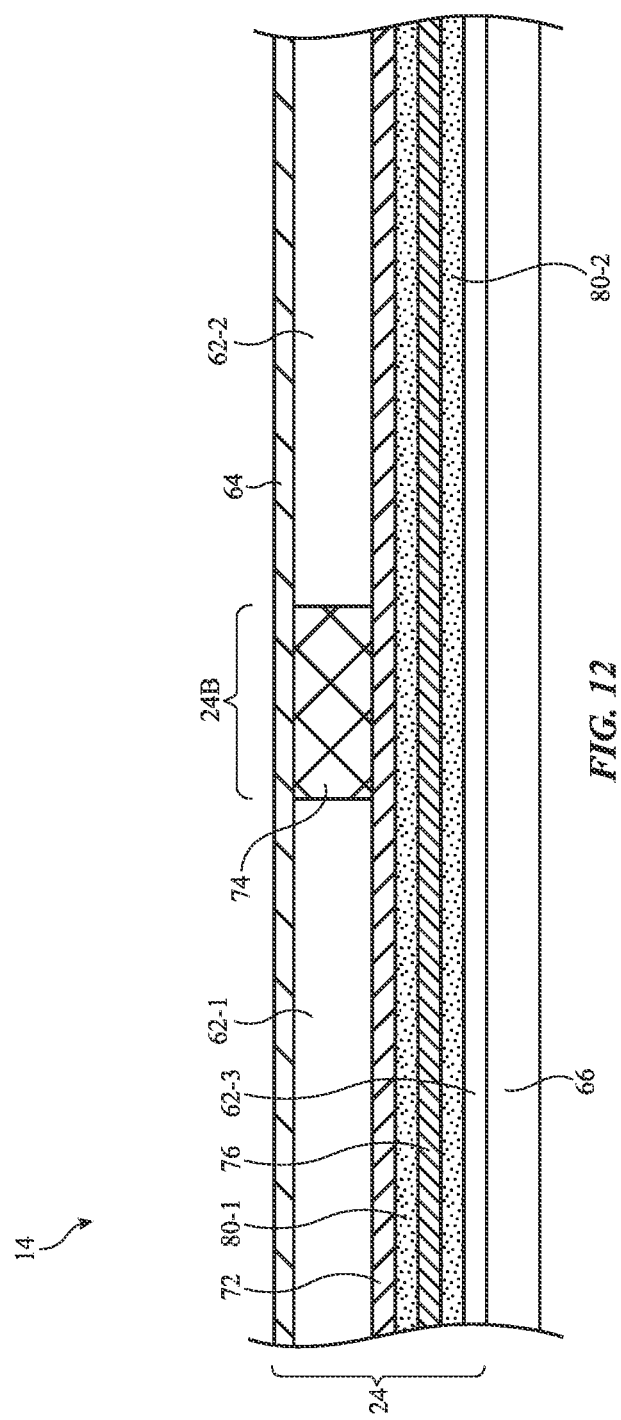
FIG. 12 is a cross-sectional side view of an illustrative display in which the display cover layer includes index-of-refraction-matching layers between layers of the display cover layer in accordance with an embodiment.

These examples are merely illustrative. In general, all of the materials within the display cover layer may be selected to have similar indices of refraction when possible. In some cases, however, there may be differences between the indices of refraction of materials within the display cover layer. Index-matching layers may be incorporated in the display cover layer to mitigate visible artifacts caused by materials having different indices of refraction. FIG. 12 is a cross-sectional side view of a display having a display cover layer with the same arrangement as in FIG. 11. However, in addition to the components shown and discussed in connection with FIG. 11, the display cover layer of FIG. 12 includes index-of-refraction-matching layers 80-1 and 80-2 (sometimes referred to simply as index-matching layers 80-1 and 80-2).

As shown in FIG. 12, index-matching layer 80-1 is interposed between adhesive 72 and heating layer 76. Index-matching layer 80-1 may have an index of refraction that is between the index of refraction of adhesive 72 and the index of refraction of heating layer 76. Index-matching layer 80-2 is interposed between heating layer 76 and transparent dielectric layer 62-3. Index-matching layer 80-2 may have an index of refraction that is between the index of refraction of heating layer 76 and the index of refraction of transparent dielectric layer 62-3. The two index-matching layers depicted in FIG. 12 are merely illustrative. In general, index-matching layers may be incorporated between any two adjacent layers within display cover layer 24.

Figure 13:
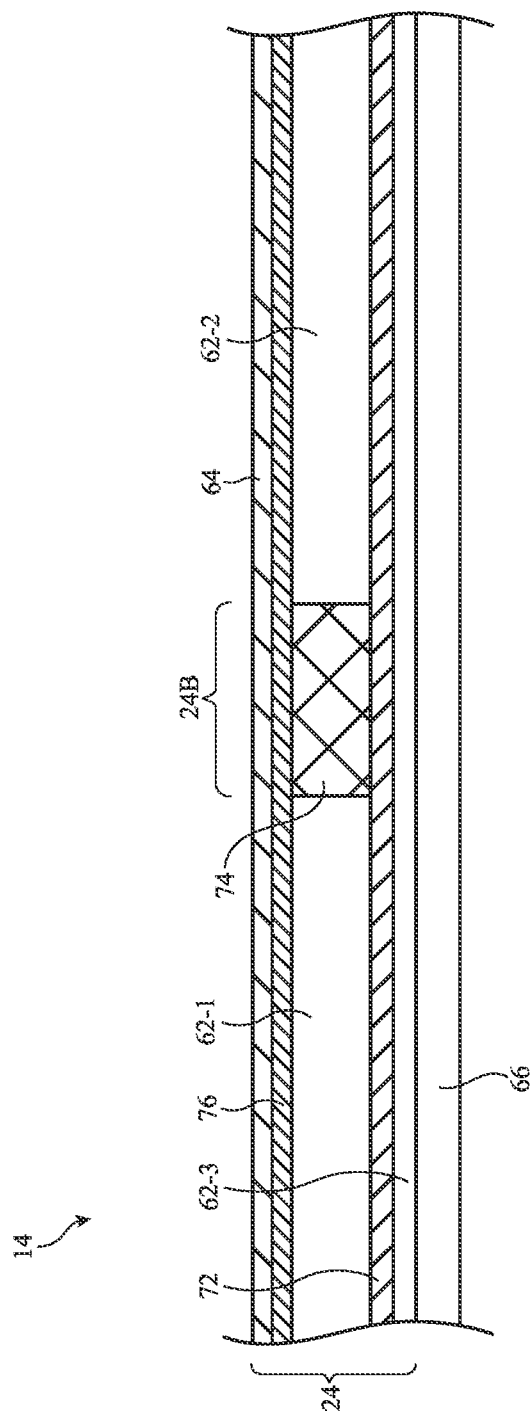
FIG. 13 is a cross-sectional side view of an illustrative display in which the display cover layer includes a self-healing coating across the display cover layer and a heating layer positioned adjacent to the self-healing coating in accordance with an embodiment.

The position of heating layer 76 in FIG. 11 is merely illustrative. In general, the heating layer for heating the self-healing material may be incorporated at any desired position within the display. FIG. 13 is a cross-sectional side view of a display having a display cover layer with the same arrangement as in FIG. 11, except for the position of the heating layer.

As shown in FIG. 13, instead of positioning the heating layer between adhesive layer 72 and transparent dielectric layer 62-3 (as in FIG. 11), the heating layer 76 (sometimes referred to as heat-generating layer 76) is positioned between self-healing coating 64 and transparent dielectric layers 62-1 and 62-2. Positioning the heating layer directly adjacent to the self-healing layer in this way may result in more of the heat generated by the heating layer reaching the self-healing layer. This may result in improved self-healing performance in the self-healing material. However, positioning the heating layer immediately adjacent the self-healing material may require the heating layer to be very flexible. To optimize the flexibility of the display cover layer, the heating layer may be positioned further from the self-healing material (e.g., as in FIG. 11).

The examples of FIGS. 9-13 of elastomer layer 74 being formed in the flexible region of the display cover layer are merely illustrative. If desired, a flexible material of another type may replace elastomer layer 74 in FIGS. 9-13. For example, a plurality of layers of thin plastic (attached together with adhesive layers) may replace elastomer layer 74.

The examples of transparent dielectric layers used in FIGS. 7-13 are also illustrative. It should be understood that, in general, any combination of transparent dielectric layers having uniform thicknesses and transparent dielectric layers having varying thicknesses may be used to form the display cover layer.

In FIGS. 11-13, examples are shown where a transparent conductor is included to form a heating element for heating the self-healing layer of the display cover layer. This type of arrangement may be used when the self-healing process of the self-healing material is initiated or expedited by heat. However, the self-healing material may instead be promoted by a different stimulus such as exposure to light or electric current.

In embodiments where the self-healing process is initiated or expedited by exposure to light, any desired light source may be used to provide the exposure to light. If exposure to visible light is a stimulus for the self-healing process, light emitted by the flexible display may be used to provide the stimulus for the self-healing process. Alternatively, a separate light source in the electronic device may be used to provide light as a stimulus for the self-healing process. In some cases, exposure to ultraviolet light may be stimulus for the self-healing process. An ultraviolet light source may be included in the electronic device to provide the ultraviolet light or ambient ultraviolet light may naturally stimulate the self-healing process without external intervention.

In yet another possible arrangement, the self-healing process may be initiated or expedited in response to an electric current. Control circuitry may be configured to apply an electric current to the self-healing material. For example, the self-healing material may be coupled to a positive power supply terminal and a ground power supply terminal.

Regardless of the type of stimulus used to initiate and/or expedite the self-healing process in the self-healing material, the control circuitry may provide the stimulus in a number of possible ways. The control circuitry may provide the stimulus in response to user input. For example, a user of the electronic device may provide instructions to the electronic device using one or more of the input-output devices in the electronic device (e.g., input-output devices 52 in FIG. 2). The user may, for example, use the input-output devices to provide instructions for immediately starting for the self-healing process. Alternatively, the user may schedule a time or times at which the self-healing process will be initiated by the stimulus. In other arrangements, the control circuitry in the electronic device may determine when to provide the stimulus. For example, the control circuitry may provide the stimulus after a predetermined amount of electronic device usage or according to a predetermined schedule. The control circuitry may analyze the device usage and provide the stimulus based on the device usage. In other embodiments, the control circuitry may provide the stimulus whenever the electronic device is being charged (e.g., when the electronic device receives wireless or wired power to provide power for operating the electronic device or to recharge the electronic device battery) or in other predetermined usage scenarios.

In FIGS. 8-13, examples are shown where separate pieces of transparent dielectric material are used instead of a single, thinned layer of transparent dielectric (as in FIG. 7). In the examples of FIGS. 8-13, materials such as elastomer 74 and/or self-healing material 64 fill a gap between transparent dielectric layers 62-1 and 62-2. There is also a transparent dielectric layer 62-3 formed under layers 62-1 and 62-2 that is uninterrupted in flexible portion 24B. This example of an arrangement for multiple transparent dielectric layers is merely illustrative. In yet another possible arrangement, a transparent dielectric layer may have a plurality of slits in flexible portion 24B to promote bending.

Figure 14:
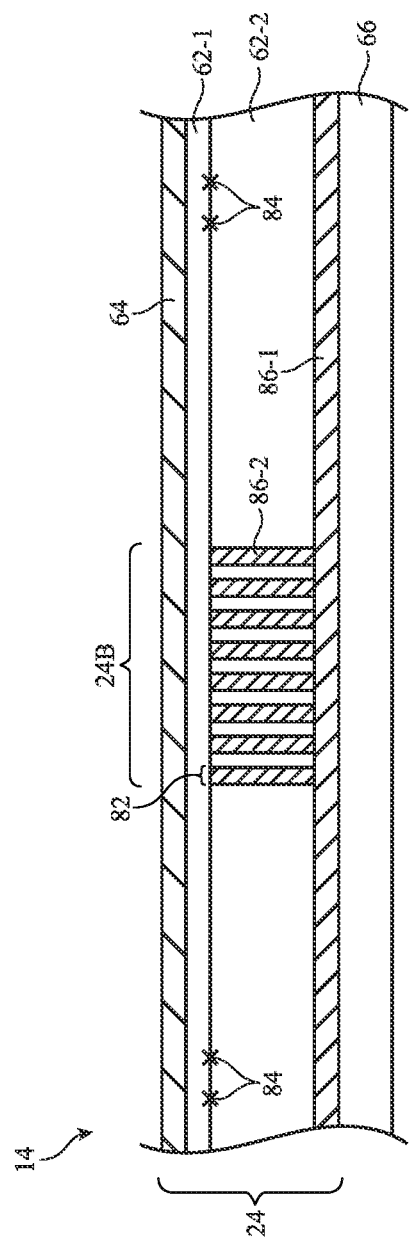
FIG. 14 is a cross-sectional side view of an illustrative display having a display cover layer with slits in a transparent dielectric layer in a flexible region of the display cover layer in accordance with an embodiment.

FIG. 14 is a cross-sectional side view of an illustrative display having a display cover layer formed from a layer of transparent dielectric material with slits. As shown in FIG. 14, display cover layer 24 includes transparent dielectric layers 62-1 and 62-2. The display cover layer may cover underlying display layers 66 in the display (e.g., substrate 36 and other layers that form the light-emitting diodes and control circuitry of FIG. 5). Transparent dielectric layers 62-1 and 62-2 may be formed from transparent layers of plastic, glass, sapphire, or any other desired material.

Transparent dielectric layer 62-2 may have a plurality of slits 82 (which may sometimes be referred to as holes, recesses, grooves, openings, etc.) in flexible portion 24B to increase the flexibility of the display cover layer. Because transparent dielectric layer 62-2 has a pattern of slits in the flexible portion of the display cover glass, transparent dielectric layer 62-2 may sometimes be referred to as a patterned transparent dielectric layer or a patterned glass layer. Transparent dielectric layer 62-2 is covered by transparent dielectric layer 62-1. The thickness of dielectric layer 62-2 may be greater than the thickness of dielectric layer 62-1 (e.g., at least two times greater, at least three times greater, at least five times greater, at least ten times greater, at least twenty times greater, etc.). With this arrangement, the dielectric cover layer may have flexibility in flexible region 24B while maintaining sufficient structural integrity in the adjacent rigid portions 24A.

Index-matching layers may be incorporated in the display cover layer to mitigate visible artifacts caused by materials having different indices of refraction. As shown in FIG. 14, the display cover layer 24 includes index-of-refraction-matching layers 86-1 and 86-2 (sometimes referred to simply as index-matching layers 86-1 and 86-2). Index-matching layer 86-1 is interposed between patterned transparent dielectric layer 62-2 and display layers 66. Index-matching layer 86-1 may have an index of refraction that is between the index of refraction of transparent dielectric layer 62-2 and the index of refraction of display layers 66 and/or may have an index of refraction that is approximately equal to (e.g., within 5% of) the index of refraction of transparent dielectric layer 62-2. Index-matching layer 86-2 may fill the slits 82 in transparent dielectric layer 62-2. Index-matching layer 86-2 may have an index of refraction that is close to or equal to the index of refraction of transparent dielectric layer 62-2 (e.g., within 10% of, within 5% of, within 1% of, within 0.1% of, etc.) to avoid the slits being visible to the user.

The nomenclature of FIG. 14, with index-matching layers 86-1 and 86-2 receiving separate labels, is merely illustrative. In one illustrative arrangement, the same material may be used to form both index-matching layers 86-1 and 86-2. In this type of arrangement, the index-matching layer may be considered to be a single, integral index-matching layer with a first portion between dielectric layer 62-2 and display layers 66 and a second portion that fills the slits in dielectric layer 62-2.

The index-matching layers may also increase the flexibility of flexible portion 24B of the display cover layer. The index-matching layers may be more elastic than dielectric layer 62-2 (and optionally more elastic than self-healing layer 64). Index-matching layers 86-1 and 86-2 may be formed from any desired material (e.g., a natural or synthetic polymer). Index-matching layers 86-1 and 86-2 may have a Young's modulus that is lower than the Young's modulus of self-healing layer 64 and/or the transparent dielectric layers 62. Because the index-matching layers may have elastomeric properties and may increase the flexibility of the display cover layer, the index-matching layers may sometimes also be referred to as elastomeric layers.

Transparent dielectric layers 62-1 and 62-2 may both be glass layers. The glass layers may be coupled together with glass-to-glass welds 84. The glass-to-glass welds may be formed using laser welding that heats the glass layers and causes the glass layers to fuse together at welds 84. This example is merely illustrative, and welds 84 may be formed using any desired techniques.

Display cover layer 24 may also include a layer of self-healing material 64, similar to as previously described in connection with FIGS. 8-13. In FIG. 14, the self-healing material is depicted as being formed over the entire display cover layer. This example is merely illustrative. If desired, the self-healing material 64 may be patterned (e.g., only formed in flexible portion 24B of the display cover layer). The self-healing material 64 from FIG. 14 may also optionally be omitted from the display cover layer.

Figure 15:
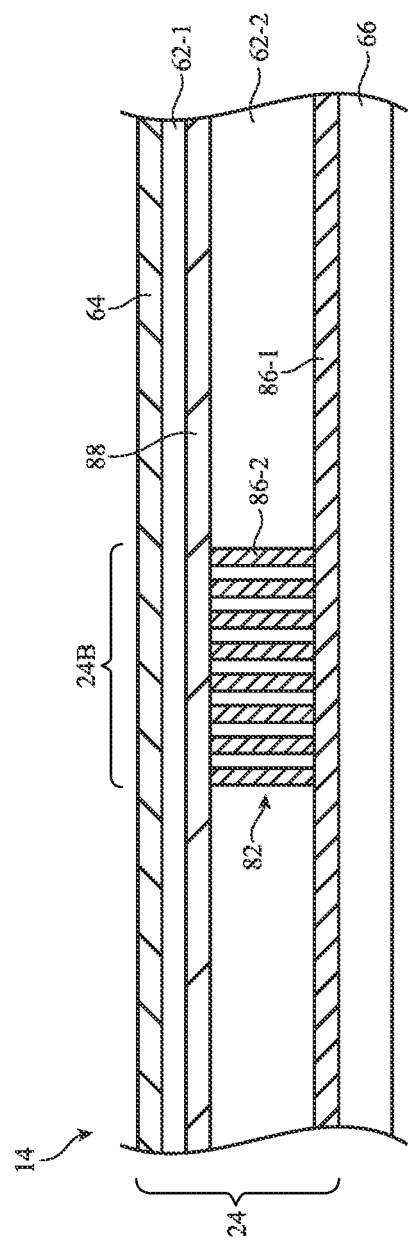
FIG. 15 is a cross-sectional side view of an illustrative display having a display cover layer with slits in a transparent dielectric layer in a flexible region of the display cover layer and a layer of adhesive between adjacent transparent dielectric layers in accordance with an embodiment.

The example in FIG. 14 of transparent dielectric layers 62-1 and 62-2 being attached together by welds 84 is merely illustrative. If desired, an adhesive layer may be used to attach transparent dielectric layer 62-1 to transparent dielectric layer 62-2. FIG. 15 is a cross-sectional side view of an illustrative display cover layer with an adhesive layer 88 between transparent dielectric layer 62-1 and transparent dielectric layer 62-2. Adhesive layer 88 may attach transparent dielectric layer 62-1 to transparent dielectric layer 62-2. Adhesive layer 88 may be formed from any desired material. In some cases, the adhesive layer may be an epoxy that includes polymer material. In other possible arrangements, adhesive layer 88 may be formed from a pressure sensitive adhesive (PSA), a liquid optically clear adhesive (LOCA), etc.

In FIGS. 14 and 15, slits 82 extend entirely through transparent dielectric layer 62-2. The slits 82 may sometimes be referred to as through-holes that extend from an upper surface of the transparent dielectric layer to a lower surface of the transparent dielectric layer. This example is merely illustrative. If desired, the slits may extend only partially into the transparent dielectric layer 62-2 (e.g., a partial through-hole that does not reach the lower surface of the transparent dielectric layer).

Figure 16:
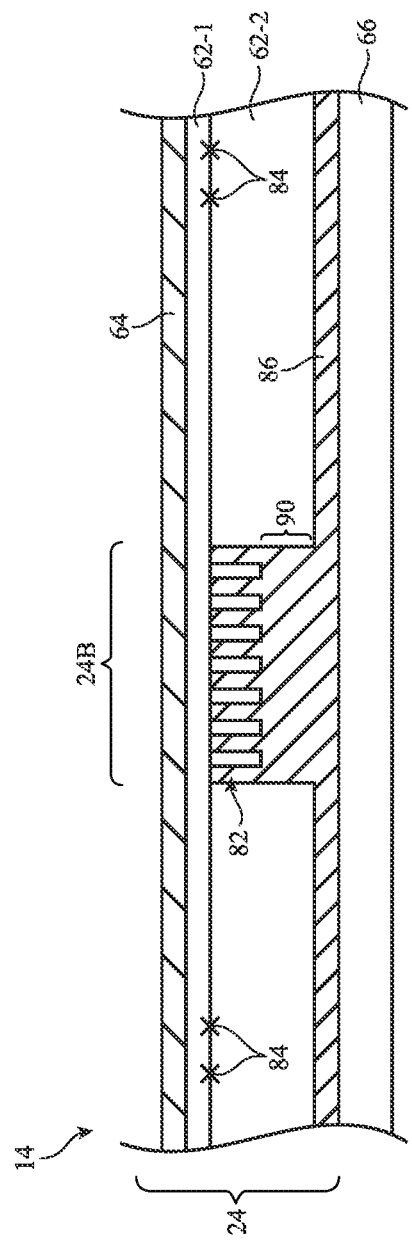
FIG. 16 is a cross-sectional side view of an illustrative display having a display cover layer with partial slits in a transparent dielectric layer in a flexible region of the display cover layer in accordance with an embodiment.

FIG. 16 is a cross-sectional side view of an illustrative display cover layer with partial slits in a transparent dielectric layer. As shown in FIG. 16, slits 82 may extend only partially through transparent dielectric layer 62-2. The separate slits may merge into a unitary opening 90 at a lower part of the flexible portion of transparent dielectric layer 62-2. Index-matching layer 86 may have a first portion that is formed between transparent dielectric layer 62-2 and display layers 66, a second portion that fills the unitary opening 90 in transparent dielectric layer 62-2, and a third portion that fills the slits 82 in transparent dielectric layer 62-2. These different portions of the index-matching layer may be formed from the same material or from different materials (similar to as discussed in connection with FIG. 14).

FIG. 16 depicts transparent dielectric layers 62-1 and 62-2 as being attached together using welds 84 (similar to as in FIG. 14). However, it should be understood that the dielectric layers may instead be attached using an adhesive layer (similar to as in FIG. 15).

Figure 17:
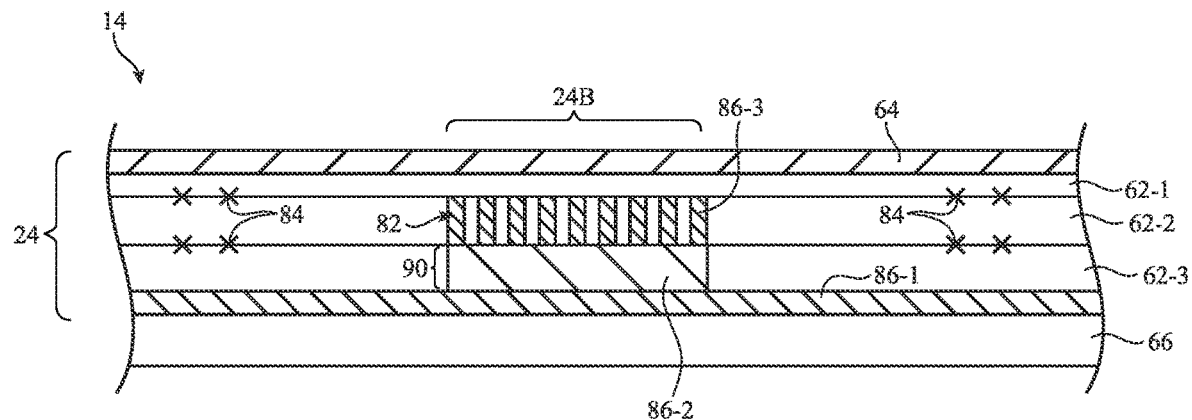
FIG. 17 is a cross-sectional side view of an illustrative display having a display cover layer with three transparent dielectric layers that include slits in a flexible region of the display cover layer in accordance with an embodiment.

FIG. 17 is a cross-sectional side view of a display cover layer showing how three transparent dielectric layers may be used instead of the two transparent dielectric layers of FIG. 16. As shown in FIG. 17, transparent dielectric layer 62-3 may have a single opening 90 in flexible portion 24B of the display cover layer. Transparent dielectric layer 62-2 may have slits 82 in flexible portion 24B of the display cover layer. Transparent dielectric layer 62-1 may cover the entire display. Dielectric layer 62-1 may be thinner than both dielectric layer 62-2 and dielectric layer 62-3 (e.g., by a factor of more than two, by a factor of more than three, by a factor of more than five, by a factor of more than ten, by a factor of more than twenty, etc.). Transparent dielectric layers 62-1, 62-2, and 62-3 may be formed from transparent layers of plastic, glass, sapphire, or any other desired material.

A first index-matching layer 86-1 may be interposed between transparent dielectric layer 62-3 and display layers 66. A second index-matching layer 86-2 may fill opening 90 in transparent dielectric layer 62-3. A third index-matching layer 86-3 may fill slits 82 in transparent dielectric layer 62-2. Similar to as discussed in connection with FIG. 14, the index-matching layers may be formed from the same material and therefore may be sometimes referred to as a single index-matching layer with various portions. It should be noted that in any of FIGS. 14-17, self-healing layer 64 may optionally be omitted or patterned.

FIG. 17 depicts transparent dielectric layers 62-1 and 62-2 as being attached together using welds 84 (similar to as in FIG. 14). However, it should be understood that the dielectric layers may instead be attached using an adhesive layer (similar to as in FIG. 15). FIG. 17 also depicts transparent dielectric layers 62-2 and 62-3 as being attached together using welds 84 (similar to as in FIG. 14). However, it should be understood that the dielectric layers may instead be attached using an adhesive layer (similar to as in FIG. 15).

In general, any interface between adjacent transparent dielectric layers may include an adhesive layer for attaching the two transparent dielectric layers or may include welds for attaching the two transparent dielectric layers.

Figure 18:
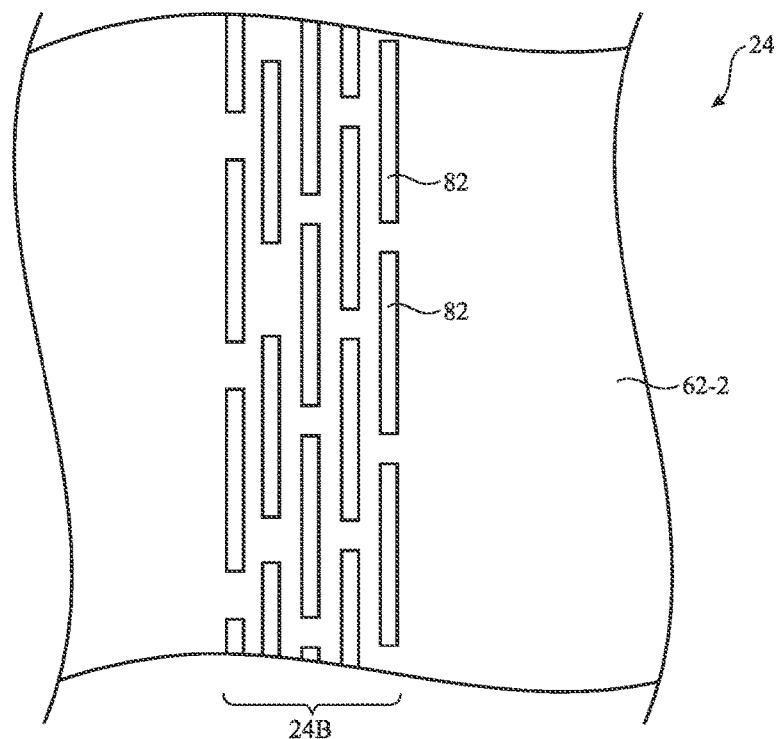
FIG. 18 is a top view of an illustrative transparent dielectric layer including slits of the type shown in FIGS. 14-17 in accordance with an embodiment.

FIG. 18 is a top view showing an illustrative arrangement for slits 82 in the flexible region 24B of display cover layer 24 (e.g., as in any of FIGS. 14-17). As shown in FIG. 18, each slit may be an elongated slit that extends along an axis that is parallel to the bend axis of flexible portion 24B (e.g., bend axis 22 in FIG. 1). The slit pattern depicted in FIG. 18 is merely illustrative. The openings may not be elongated (e.g., circular holes may be used instead of elongated slits). The slits may include zig-zags (e.g., portions that are angled relative to the bend-axis). In general, any desired number and shapes of openings may be formed in the transparent dielectric layer 62-2.

FIGS. 7-18 depict a display cover layer for a display that bends along a single bend-axis (as depicted in FIG. 1, for example). However, it should be understood that the flexible display cover layer regions shown and described in FIGS. 7-18 may be applied to a display that bends along any desired number of bend-axes. The display cover layer may bend along one, two, or more than two bend-axes. The display cover layer may have a flexible region along each bend-axis. In one possible arrangement, the entire display cover layer may be flexible.

The foregoing is merely illustrative and various modifications can be made to the described embodiments. The foregoing embodiments may be implemented individually or in any combination.

What is claimed is:

1. An electronic device, comprising:
   a housing that bends about a bend axis; and
   a display in the housing that bends about the bend axis, wherein the display comprises a display cover layer having first and second rigid portions and a flexible portion interposed between the first and second rigid portions, wherein the first and second rigid portions comprise first and second respective transparent dielectric layers, wherein the flexible portion comprises a layer of elastomer that is interposed between the first and second transparent dielectric layers, and wherein the display cover layer includes a self-healing polymer layer that is formed over the layer of elastomer and the first and second transparent dielectric layers.

2. The electronic device defined in claim 1, wherein the display cover layer further comprises an adhesive layer that attaches the first and second transparent dielectric layers and the layer of elastomer to a third transparent dielectric layer.

3. The electronic device defined in claim 2, wherein the adhesive layer is an optically clear adhesive layer.

4. The electronic device defined in claim 2, wherein the display cover layer further comprises a transparent conductor layer used to generate heat to promote self-healing in the self-healing polymer layer.

5. The electronic device defined in claim 4, wherein the transparent conductor layer is interposed between the adhesive layer and the third transparent dielectric layer.

6. The electronic device defined in claim 4, wherein the transparent conductor layer is interposed between the first and second transparent dielectric layers and the self-healing polymer layer and wherein the transparent conductor layer is interposed between the layer of elastomer and the self-healing polymer layer.

7. The electronic device defined in claim 1, wherein the self-healing polymer layer extends across an entire exterior surface of the display cover layer.

8. The electronic device defined in claim 1, wherein the elastomer has a lower Young's modulus than the self-healing polymer layer.

9. An electronic device, comprising:
- a housing that bends about a bend axis; and
- a display in the housing that bends about the bend axis, wherein the display comprises a display cover layer having first and second rigid portions and a flexible portion interposed between the first and second rigid portions, wherein the first and second rigid portions comprise first and second respective transparent dielectric layers, wherein the flexible portion comprises a first layer that is interposed between the first and second transparent dielectric layers, wherein the display cover layer includes a second layer that is formed over the first layer and the first and second transparent dielectric layers, and wherein the display cover layer further comprises an adhesive layer that attaches the first and second transparent dielectric layers and the first layer to a third transparent dielectric layer.

10. The electronic device defined in claim 9, wherein the second layer is a self-healing polymer layer.

11. The electronic device defined in claim 9, wherein the adhesive layer is an optically clear adhesive layer.

12. The electronic device defined in claim 9, wherein the second layer extends across an entire exterior surface of the display cover layer.

13. The electronic device defined in claim 9, wherein the first layer comprises elastomer.

14. The electronic device defined in claim 9, wherein the first layer has a lower Young's modulus than the second layer and the second layer has a lower Young's modulus than the first and second transparent dielectric layers.

15. An electronic device, comprising:
- a flexible display having a bending region that bends about a bend axis, wherein the flexible display includes display layers configured to emit light and a display cover layer, wherein the display cover layer covers the display layers, and wherein the display cover layer comprises:
  - a first rigid portion comprising a first transparent dielectric layer;
  - a second rigid portion comprising a second transparent dielectric layer;
  - a flexible portion comprising a first layer interposed between the first and second transparent dielectric layers;
  - a second layer formed over the first and second transparent dielectric layers and the first layer; and
  - a conductor layer interposed between the second layer and the display layers.

16. The electronic device defined in claim 15, wherein the conductor layer is a transparent conductor layer.

17. The electronic device defined in claim 15, wherein the second layer is a self-healing polymer layer that extends across an entire exterior surface of the display cover layer.

18. The electronic device defined in claim 17, wherein the conductor layer is used to generate heat in the self-healing polymer layer.

19. The electronic device defined in claim 17, wherein the display cover layer further comprises a third transparent dielectric layer and wherein the conductor layer is interposed between the first layer and the third transparent dielectric layer.

20. The electronic device defined in claim 17, wherein the conductor layer is interposed between the first and second transparent dielectric layers and the self-healing polymer layer and wherein the conductor layer is interposed between the first layer and the self-healing polymer layer.

* * * * *